(12) United States Patent
Park et al.

(10) Patent No.: US 10,009,042 B2
(45) Date of Patent: Jun. 26, 2018

(54) METHOD AND APPARATUS FOR CONTROLLING INTERLEAVING DEPTH

(71) Applicant: Samsung Electronics Co., Ltd., Suwon-si (KR)

(72) Inventors: Chang Soon Park, Chungju-si (KR); Youngsoo Kim, Seoul (KR); Jaewook Shim, Yongin-si (KR); Young Jun Hong, Seoul (KR); Hyosun Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 14/657,159

(22) Filed: Mar. 13, 2015

(65) Prior Publication Data

US 2015/0263766 A1  Sep. 17, 2015

(30) Foreign Application Priority Data

Mar. 14, 2014 (KR) ............. 10-2014-0030396
Feb. 16, 2015 (KR) ............. 10-2015-0023065

(51) Int. Cl.
*H03M 13/00* (2006.01)
*H03M 13/27* (2006.01)
*H03M 13/15* (2006.01)

(52) U.S. Cl.
CPC ... *H03M 13/2789* (2013.01); *H03M 13/2707* (2013.01); *H03M 13/152* (2013.01); *H03M 13/618* (2013.01)

(58) Field of Classification Search
None
See application file for complete search history.

(56) References Cited

U.S. PATENT DOCUMENTS

| 5,928,371 | A | * | 7/1999 | Robinson, Jr. | ........ | H04L 1/0071 |
| | | | | | | 714/702 |
| 6,536,001 | B1 | * | 3/2003 | Cai | ................... | H03M 13/2732 |
| | | | | | | 714/701 |
| 7,543,197 | B2 | | 6/2009 | Palanki et al. | | |

(Continued)

FOREIGN PATENT DOCUMENTS

EP  1 113 581 A2  7/2001
JP  7-288479 A  10/1995

(Continued)

OTHER PUBLICATIONS

International Search Report dated Jun. 16, 2015, in counterpart international application No. PCT/KR2015/002327 (4 pages in English).

(Continued)

*Primary Examiner* — Daniel McMahon
(74) *Attorney, Agent, or Firm* — NSIP Law

(57) ABSTRACT

A method and an apparatus for controlling an interleaving depth are provided. The interleaving depth controlling method includes performing a modulo operation on an interleaving depth selected to be less than or equal to a maximum interleaving depth and a total number of codewords to obtain a number of remaining codewords; and comparing the total number of the codewords to the interleaving depth, when the number of the remaining codewords excludes "0", to control the interleaving depth.

19 Claims, 8 Drawing Sheets

(56) References Cited

U.S. PATENT DOCUMENTS

| | | | |
|---|---|---|---|
| 8,015,475 B2* | 9/2011 | Lu | H03M 13/1515 714/761 |
| 8,156,778 B2* | 4/2012 | Mantri | H04L 1/0041 375/219 |
| 8,898,533 B2* | 11/2014 | Christiaens | 714/748 |
| 2002/0188905 A1 | 12/2002 | Hollums | |
| 2003/0225958 A1* | 12/2003 | Efland | G06F 9/52 711/1 |
| 2007/0186139 A1 | 8/2007 | Kim et al. | |
| 2010/0111148 A1 | 5/2010 | Tzannes | |
| 2011/0197104 A1 | 8/2011 | Nimbalker et al. | |
| 2012/0198307 A1* | 8/2012 | Kibe | H03M 13/11 714/758 |
| 2013/0287046 A1 | 10/2013 | Heise | |

FOREIGN PATENT DOCUMENTS

| | | |
|---|---|---|
| JP | 2006-94048 A | 4/2006 |
| JP | 2012-217114 A | 11/2012 |
| KR | 10-2007-0080921 A | 8/2007 |
| KR | 10-2009-0014333 A | 2/2009 |
| KR | 10-2009-0065141 A | 6/2009 |
| WO | WO 02/061962 A1 | 8/2002 |

OTHER PUBLICATIONS

Haykin, S., "Communication Systems" John Wiley & Sons, 2008 (838 pages in English).
Partial Supplementary Search Report dated Oct. 13, 2017 in corresponding European Patent Application No. 15762096.4 (15 pages in English).

* cited by examiner

METHOD AND APPARATUS FOR CONTROLLING INTERLEAVING DEPTH

CROSS-REFERENCE TO RELATED APPLICATION

This application claims the benefit under 35 USC 119(a) of Korean Patent Application No. 10-2014-0030396, filed on Mar. 14, 2014, and Korean Patent Application No. 10-2015-0023065, filed on Feb. 16, 2015, in the Korean Intellectual Property Office, the entire disclosures of which are incorporated herein by reference for all purposes.

BACKGROUND

1. Field

The following description relates to a method and an apparatus to control an interleaving depth, and more particularly, to a method and an apparatus to control an interleaving depth to perform interleaving in a digital communication system.

2. Description of Related Art

Research on a digital wireless communication system has been conducted to overcome various abnormal channel environments including noise. In line with the research, studies have been conducted on various methods to improve speed on signal transmission and reception processing and improve reliability. Among the various methods, a method of transmitting and receiving digital bit information using a more effective modulation and demodulation method is actively being researched.

Also, error-correcting code technology may be used as an effective method to improve communication reliability in the digital communication system. An error occurs when bit information is not received intact at a receiver due to various abnormal communication channel environments including random noise. The error-correcting code technology detects and corrects the error and restores the original bit information desired to be transmitted, thereby improving the communication reliability.

However, a method of interleaving a codeword block is needed to improve the communication reliability in the digital communication system. The interleaving method would enable robust digital communication against an occurrence of an error by interleaving and transmitting a codeword block based, for instance, on a predetermined interleaving depth.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative configuration, there is provided an interleaving depth controlling method, including performing a modulo operation on an interleaving depth selected to be less than or equal to a maximum interleaving depth and a total number of codewords to obtain a number of remaining codewords; and comparing the total number of the codewords to the interleaving depth, when the number of the remaining codewords excludes "0", to control the interleaving depth.

In response to the interleaving depth being greater than the total number of the codewords, the method may also include controlling the interleaving depth to be the number of the remaining codewords.

In response to the interleaving depth being less than or equal to the total number of the codewords, the method may also include comparing a sum of the number of the remaining codewords and the interleaving depth to the maximum interleaving depth.

The method may also include determining an interleaving block with respect to the codewords based on a result of the comparing.

The method may also include in response to the sum of the number of the remaining codewords and the interleaving depth being less than or equal to the maximum interleaving depth, controlling an interleaving depth to be applied to a last interleaving block to be the sum of the number of the remaining codewords and the interleaving depth, wherein a size of the last interleaving block corresponds to a sum of the number of the remaining codewords and the interleaving depth prior to the controlling.

The method may also include in response to the sum of the number of the remaining codewords and the interleaving depth being greater than the maximum interleaving depth, controlling an interleaving depth to be applied to each of last two interleaving blocks based on the sum of the number of the remaining codewords and the interleaving depth.

The interleaving depth to be applied to each of the last two interleaving blocks may be controlled to be a smallest integer among integers greater than or equal to an average between the number of the remaining codewords and the interleaving depth, and to be a greatest integer among integers less than or equal to the average between the number of the remaining codewords and the interleaving depth.

The interleaving depth may be selected based on a modulation size, which is a number of bits to be mapped to a single symbol.

In accordance with another illustrative configuration, there is provided a computer program embodied on a non-transitory computer readable medium, the computer program being configured to control a processor to perform the method described above.

In accordance with an illustrative configuration there is provided a deinterleaving depth controlling method, including performing a modulo operation on a deinterleaving depth selected to be less than or equal to a maximum deinterleaving depth and a total number of codewords to obtain a number of remaining codewords; and comparing the total number of the codewords to the deinterleaving depth, when the number of the remaining codewords excludes "0", to control the deinterleaving depth.

In response to the deinterleaving depth being greater than the total number of the codewords the method may also include controlling the deinterleaving depth to be the number of the remaining codewords.

In response to the deinterleaving depth being less than or equal to the total number of the codewords, the method may also include comparing a sum of the number of the remaining codewords and the deinterleaving depth to the maximum deinterleaving depth.

The method may also include determining a deinterleaving block with respect to the codewords based on a result of the comparing.

The method may also include in response to the sum of the number of the remaining codewords and the deinterleaving depth being less than or equal to the maximum deinterleaving depth, the method controls a deinterleaving depth to be applied to a last deinterleaving block to be the sum of the number of the remaining codewords and the deinterleaving depth, wherein a size of the last deinterleaving block corresponds to a sum of the number of the remaining codewords and the deinterleaving depth prior to the controlling.

The method may also include in response to the sum of the number of the remaining codewords and the deinterleaving depth being greater than the maximum deinterleaving depth, controlling a deinterleaving depth to be applied to each of last two deinterleaving blocks based on the sum of the number of the remaining codewords and the deinterleaving depth.

The deinterleaving depth to be applied to each of the last two deinterleaving blocks may be controlled to be a smallest integer among integers greater than or equal to an average between the number of the remaining codewords and the deinterleaving depth, and to be a greatest integer among integers less than or equal to the average between the number of the remaining codewords and the deinterleaving depth.

The controlling of the deinterleaving depth may include controlling the deinterleaving depth to be equal to an interleaving depth applied to the codewords.

In accordance with an illustrative configuration, there is provided a computer program embodied on a non-transitory computer readable medium, the computer program being configured to control a processor to perform the method described above.

In accordance with another illustrative configuration, there is provided an interleaving depth controlling method, including selecting a first interleaving depth with respect to a codeword based on a number of the codeword and a maximum interleaving depth; and interleaving the codeword by applying the first interleaving depth.

The selecting of the first interleaving depth may include obtaining a number of remaining codewords resulting from a modulo operation performed on the number of the codeword and a basic interleaving depth; and selecting the first interleaving depth based on a result of comparing a sum of the number of the remaining codewords and the basic interleaving depth to the maximum interleaving depth.

The method may also include determining an interleaving block with respect to all codewords based on the result of the comparing.

The method may also include in response to the sum of the number of the remaining codewords and the basic interleaving depth being less than or equal to the maximum interleaving depth, selecting the first interleaving depth to be applied to a last interleaving block to be the sum of the number of the remaining codewords and the basic interleaving depth, and wherein a size of the last interleaving block corresponds to the sum of the number of the remaining codewords and the basic interleaving depth.

The method may also include in response to the sum of the number of the remaining codewords and the basic interleaving depth being greater than the maximum interleaving depth, selecting the first interleaving depth to be applied to each of last two interleaving blocks based on the sum of the number of the remaining codewords and the basic interleaving depth.

In accordance with an illustrative configuration, there is provided a computer program embodied on a non-transitory computer readable medium, the computer program being configured to control a processor to perform the method described above.

In accordance with another illustrative configuration, there is provided an interleaving depth controlling apparatus, including an acquirer configured to perform a modulo operation on an interleaving depth selected to be less than or equal to a maximum interleaving depth and a total number of codewords to obtain a number of remaining codewords; a first comparer configured to compare the total number of the codewords to the interleaving depth when the number of the remaining codewords excludes "0" and output a result indicative thereof; and a depth controller configured to control the interleaving depth based on the result.

The apparatus may also include in response to the interleaving depth being less than or equal to the total number of the codewords, a second comparer configured to compare a sum of the number of the remaining codewords and the interleaving depth to the maximum interleaving depth.

The depth controller may control the interleaving depth based on a result of the comparing of the sum of the number of the remaining codewords and the interleaving depth to the maximum interleaving depth, and may also include an interleaving block determiner configured to determine an interleaving block based on the result of the comparing.

In response to the interleaving depth being greater than the total number of the codewords, the depth controller may control the interleaving depth to be the number of the remaining codewords, and may also include an interleaving block determiner configured to determine all of the codewords to be one interleaving block.

In response to a sum of the number of the remaining codewords and the interleaving depth being less than or equal to the maximum interleaving depth, the depth controller may control an interleaving depth to be applied to a last interleaving block to be the sum of the number of the remaining codewords and the interleaving depth.

In response to a sum of the number of the remaining codewords and the interleaving depth being greater than the maximum interleaving depth, the apparatus may also include an interleaving block determiner configured to determine the remaining codewords to be two interleaving blocks, wherein the two determined interleaving blocks correspond to a last portion of the codewords, and the depth controller controls an interleaving depth to be applied to each of the last two interleaving blocks based on the sum of the number of the remaining codewords and the interleaving depth.

In response to a sum of the number of the remaining codewords and the interleaving depth being greater than the maximum interleaving depth, may also include an interleaving block determiner configured to determine the remaining codewords to be two interleaving blocks, wherein the depth controller controls an interleaving depth to be applied to each of the last two interleaving blocks to be a smallest integer among integers greater than or equal to an average between the number of the remaining codewords and the interleaving depth, and controls the interleaving depth to be a greatest integer among integers less than or equal to the average between the number of the remaining codewords and the interleaving depth.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which.

Figure 1:
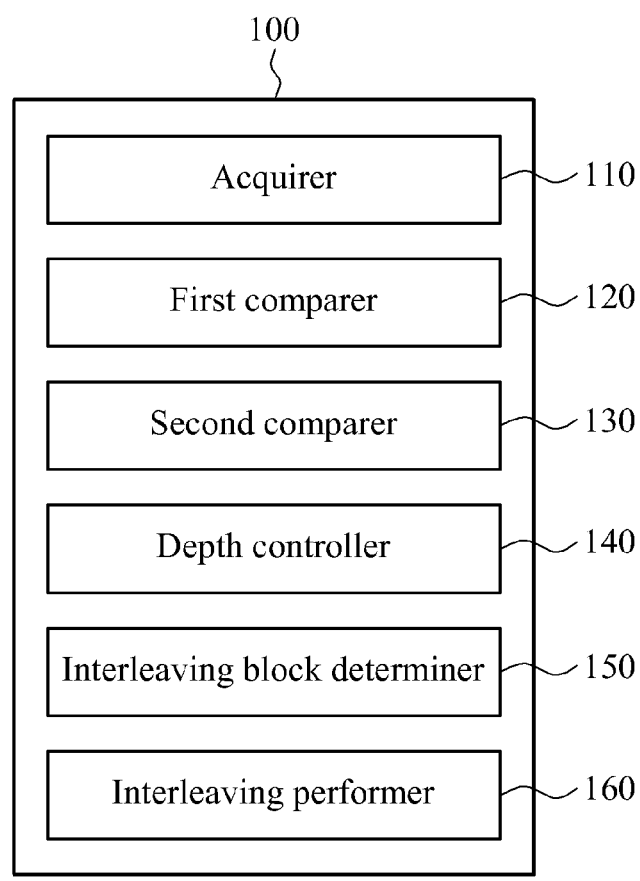
FIG. 1 is a block diagram illustrating an example of a configuration of an interleaving depth controlling apparatus, in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 is a block diagram illustrating an example of a configuration of an interleaving depth controlling apparatus 100, in accordance with an embodiment.

When multi-bit modulation and demodulation technology is combined with error-correcting code technology, the interleaving depth controlling apparatus 100 is used to control an interleaving depth to maximize reliability.

The multi-bit modulation and demodulation technology processes bit sequences to be one symbol and performs spread spectrum from the one symbol to a code sequence. Through such a multi-bit modulation and demodulation technology, a transmission rate and reliability is improved.

Through the multi-bit modulation and demodulation method, multiple sets of bit information processed to be one symbol are transmitted during a period of time; thus, improving a transmission rate in comparison to a method that transmits a single bit during the same period of transmission time of the one symbol. In addition, the reliability is improved by configuring each symbol to be mapped to a code sequence to have an improved correlation characteristic.

For example, when different bit sequences, for example, [0 0], [0 1], [1 0], and [1 1], having a transmission length of 2 are to be transmitted, the bit sequences may be spread to code sequences, for example, [1 1 1 1], [1 −1 1 −1 1], [1 1 −1 −1 1], and [1 −1 −1 1], having a code length of 4 to be transmitted.

In addition, the error-correcting code technology detects an occurrence of an error and corrects the error to improve the communication reliability in the digital communication system. Through the error-correcting code technology, original bit information desired to be transmitted is restored, thereby improving the communication reliability.

An error-correcting code is divided into a block code and a convolutional code. The convolutional code is a type of error-correcting code that generates parity symbols via the sliding application of a boolean polynomial function to a data stream. The sliding application represents the "convolution" of the encoder over the data. The block code is widely used, and encoding is performed in a block unit having a predetermined length. An encoded bit sequence with a predetermined length is formed by adding a parity bit, which is also referred to as a redundant bit, to message bit information with a predetermined length.

For example, a total of n bit sequence blocks are formed and transmitted by adding n-k parity bits corresponding to redundant bits to k message bits corresponding to original bit information desired to be sent.

A bit sequence block is expressed as a (n,k) block code, and a codeword is an n-bit sequence, which is an output of an encoder. The foregoing message bits may not be changed and be transmitted in a form of only the parity bits being added. Such message bits are referred to as a systematic code. The systematic code is an error-correcting code in which the input data is embedded in the encoded output. Systematic codes have the advantage that the parity data can simply be appended to the source block, and receivers do not need to recover the original source symbols if received correctly.

Each error-correcting code may have an error-correcting capability. For example, when one codeword including n bits is received by a receiver, original bit information desired to be transmitted may be completely restored although a maximum number t of error bits occurs due to an abnormal channel environment, such as noise. In such an example, the error-correcting code is referred to as an error-correcting code having a t-error correcting capability.

The error-correcting code is transmitted through interleaving signal processing. Interleaving is a method of mixing and transmitting the mixed codewords instead of transmitting the codewords sequentially. Because a maximum number of correctable error bits in a codeword is fixed, error correction is not properly performed without the interleaving when a number of errors greater than the maximum number of correctable error bits occurs between adjacent bits.

For example, when one codeword includes n bits and a number of codewords having the n bits is d, the d codewords may be formed to be one interleaving block, and the interleaving may be performed on the d*n interleaving blocks. A value of d may be an interleaving depth.

Referring to FIG. 1, the interleaving depth controlling apparatus 100 includes an acquirer 110, a first comparer 120, a second comparer 130, a depth controller 140, an interleaving block determiner 150, and an interleaving performer 160.

The acquirer 110 obtains a number ($d_R$) of remaining codewords by performing a modulo operation on an interleaving depth (d) selected to be less than or equal to a maximum interleaving depth ($d_{max}$) and a total number ($M_B$) of all codewords. In one illustrative example, the modulo operation finds the remainder after division of one number by another. Given two positive numbers, a (the dividend) and n (the divisor), a modulo n is the remainder of the Euclidean division of a by n. The maximum interleaving depth is set as a maximum allowable interleaving depth for a system. In an example, the interleaving depth used to perform interleaving is selected within a range of the maximum interleaving depth. In another example, the interleaving depth is selected based on a modulation size, which is a number of bits to be mapped to a single symbol.

In a case of a plurality of modulation sizes, the maximum interleaving depth is set as a largest modulation size among the plurality of modulation sizes. For example, when the plurality of modulation sizes is 1, 2, 3, 4, and 5, the maximum interleaving depth is set as 5. As described in the foregoing, the maximum interleaving depth is set within an allowable range for the system.

The interleaving is performed on all the codewords based on the selected interleaving depth. When the total number of the codewords is an integer multiple of the interleaving depth, the interleaving is performed on all the codewords at the interleaving depth, without controlling the interleaving depth.

However, when the total number of the codewords is not an integer multiple of the interleaving depth, the interleaving depth is not applied to a remaining interleaving block, among interleaving blocks on which the interleaving is performed, in which the remaining codewords are included.

When the interleaving depth is not controlled, the interleaving is not performed on the remaining codewords or the interleaving is performed using a zero-padded codeword. Thus, the interleaving is not effective in terms of a transmission rate and reliability. Accordingly, the remaining codewords need to be obtained by performing the modulo operation on a total number of the codewords and the interleaving depth as represented in Equation 1.

$$d_R = \mod(M_B, d) \quad \text{[Equation 1]}$$

When the number of the remaining codewords is not "0," the first comparer 120 compares the total number of the codewords to the interleaving depth. As described in the foregoing, when the number of the remaining codewords is not zero, the interleaving depth may need to be controlled.

Conversely, when the number of the remaining codewords is "0," controlling the interleaving depth may be unnecessary and; thus, the interleaving performer 160 performs the interleaving with respect to the all codewords by applying the existing interleaving depth.

Thus, the first comparer 120 compares the total number of the codewords to the interleaving depth to determine whether to control the interleaving depth.

The depth controller 140 controls the interleaving depth based on a result of the comparison performed by the first comparer 120. When the interleaving depth is greater than the total number of the codewords as the result of the comparison, the depth controller 140 controls the interleaving depth to be the number of the remaining codewords. The interleaving is then performed by applying, to the all codewords, the interleaving depth controlled to be the number of the remaining codewords.

When the interleaving depth is less than or equal to the total number of the codewords, the second comparer 130 compares a sum of the number of the remaining codewords and the interleaving depth to the maximum interleaving depth.

When the interleaving depth is greater than the total number of the codewords, only one interleaving block on which the interleaving is to be performed may exist. Thus, the depth controller 140 controls the interleaving depth to be the number of the remaining codewords so that the interleaving depth is suitable for the interleaving block.

Conversely, when the interleaving depth is less than or equal to the total number of the codewords, at least two interleaving blocks on which the interleaving is to be performed exist. Thus, the depth controller 140 controls the interleaving depth differently based on a result of comparing the sum of the number of the remaining codewords and the interleaving depth to the maximum interleaving depth by the second comparer 130.

When the interleaving depth is greater than the total number of the codewords, the interleaving block determiner 150 determines all of the codewords to be one interleaving block.

Conversely, when the interleaving depth is less than or equal to the total number of the codewords, the interleaving block determiner 150 determines an interleaving block based on a result of comparing the interleaving depth, or the sum of the number of the remaining codewords and the interleaving depth, to the maximum interleaving depth.

When the sum of the number of the remaining codewords and the interleaving depth is less than or equal to the maximum interleaving depth, the depth controller 140 controls an interleaving depth to be applied to a last interleaving block to be the sum of the number of the remaining codewords and the interleaving depth.

When the sum of the number of the remaining codewords and the interleaving depth is less than or equal to the maximum interleaving depth, the interleaving block determiner 150 determines the remaining codewords and codewords corresponding to the interleaving depth to be the last interleaving block prior to being controlled. The codewords corresponding to the interleaving depth prior to being controlled are codewords immediately prior to the remaining codewords. Because the interleaving depth of the last interleaving block is less than or equal to the maximum interleaving depth, the interleaving depth controlling apparatus 100 performs the interleaving on the last interleaving block by controlling the interleaving depth to be the sum of the number of the remaining codewords and the interleaving depth.

When the sum of the number of the remaining codewords and the interleaving depth is greater than the maximum interleaving depth, the interleaving block determiner 150 determines the remaining codewords to be two interleaving blocks. The two determined interleaving blocks correspond to a last portion of the all codewords and; thus, the two interleaving blocks will be hereinafter referred to as two last interleaving blocks.

When the sum of the number of the remaining codewords and the interleaving depth is greater than the maximum interleaving depth, the depth controller 140 controls an interleaving depth to be applied to each of the last two interleaving blocks based on the sum of the number of the remaining codewords and the interleaving depth.

Also, when the sum of the number of the remaining codewords and the interleaving depth is greater than the maximum interleaving depth, forming one interleaving block and performing the interleaving on the interleaving block is not possible. As a result, the block may need to be divided.

In such a case, the depth controller 140 controls an interleaving depth to be applied to each of the last two interleaving blocks to be a smallest integer among integers greater than or equal to an average between the number of the remaining codewords and the interleaving depth. The depth controller 140 also controls the interleaving depth to be a greatest integer among integers less than or equal to the average between the number of the remaining codewords and the interleaving depth.

For example, when an interleaving depth is 4, a number of remaining codewords is 2, and a maximum interleaving depth is 5, an average between the number of the remaining codewords and the interleaving depth is 3. In such an example, the interleaving depth to be applied to each of the last two interleaving blocks is controlled to be 3.

For another example, when an interleaving depth is 5, a number of remaining codewords is 2, and a maximum interleaving depth is 5, an average between the number of the remaining codewords and the interleaving depth may be 3.5. In such an example, the interleaving depth to be applied to each of the last two interleaving blocks is controlled to be 4 and 3, respectively.

As described in the foregoing, the interleaving depth controlling apparatus 100 utilizes the maximum allowable interleaving depth. However, increasing the interleaving depth to be unnecessarily high may result in an increase in time delay between transmission and reception.

In addition, the interleaving depth controlling apparatus 100 effectively prevents an interleaving depth of an interleaving block from excessively decreasing, compared to an initially set interleaving depth, due to the remaining codewords. Thus, a decrease in a packet error rate is overcome.

Table 1 provides a description of operations of the interleaving method.

TABLE 1

| Condition | | Number of interleaving blocks | Interleaving Procedure |
|---|---|---|---|
| $d_R = 0$ | | $N_B$ | Apply an interleaving depth "d" to all "$N_B$" blocks. |
| $d_R \neq 0$ | $M_B < d$ | 1 | Apply an interleaving depth "$d_R$" to a single block. "$d_R$" is a number of remaining codewords. |
| | $M_B > d$ $\quad d + d_R \leq d_{max}$ | $N_B - 1$ | Apply an interleaving depth "d" to first $N_B - 2$ blocks, and "$d + d_R$" to a last one block. |
| | $d + d_R > d_{max}$ | $N_B$ | Apply an interleaving depth "d" to first $N_B - 2$ blocks, and $\lceil d + d_R)/2 \rceil$ and $\lfloor (d + d_R)/2 \rfloor$ to last two blocks in order. |

In Table 1, $d_R$ is mod($M_B$, d) ($d_R$=mod($M_B$, d), $N_B$=$\lceil M_B/d \rceil$," "$\lceil x \rceil$" is a smallest integer among integers greater than or equal to "x," and "$\lfloor x \rfloor$" is a greatest integer among integers less than or equal to "x." For example, based on the interleaving procedure described in Table 1, when $M_B$ is 14, d is 3, and $d_{max}$ is 5, $d_R$ becomes 2 and $N_B$ becomes 5. Thus, an interleaving depth is set to be "3" for all the initial three interleaving blocks, and an interleaving depth is set to be "5," which is a sum (d+$d_R$) of "d" and "$d_R$," for a last one interleaving block, and the interleaving is then performed.

Table 2 indicates interleaving depth values in each interleaving block expressed as row vectors, and simplified as interleaving depth sequences.

TABLE 2

| Condition | | | Interleaving depth sequence |
|---|---|---|---|
| | $d_R = 0$ | | d · ones($N_B$) |
| $d_R \neq 0$ | $M_B < d$ | | $d_R$ |
| | $M_B > d$ | $d + d_R \leq d_{max}$ | [d · ones($N_B$ − 2), d + $d_R$] |
| | | $d + d_R > d_{max}$ | [d · ones($N_B$ − 2), $\lceil (d + d_R)/2 \rceil$, $\lfloor (d + d_R)/2 \rfloor$] |

In Table 2, "ones(m)" denotes an all-one row vector having m elements.

For example, based on the interleaving depth sequences described in Table 2, when an interleaving depth sequence is "[d·ones($N_B$−2), d+$d_R$]," an interleaving depth "d" is applied to initial $N_B$−2 interleaving blocks, and an interleaving depth "d+$d_R$" is applied to a last interleaving block.

The interleaving performer 160 applies the interleaving depth and the controlled interleaving depth to perform the interleaving with respect to at least one codeword.

The foregoing description of the interleaving depth controlling apparatus 100 is provided for the interleaving to be performed from a transmitting end. However, the interleaving may not be limited thereto. At a receiving end, deinterleaving corresponding to signal processing opposite to the interleaving performed at the transmitting end may be performed. A configuration of a deinterleaving depth controlling apparatus and method at the receiving end may be same or substantially the same to a configuration of the interleaving depth controlling apparatus 100 and method at the transmitting end.

Figure 2:
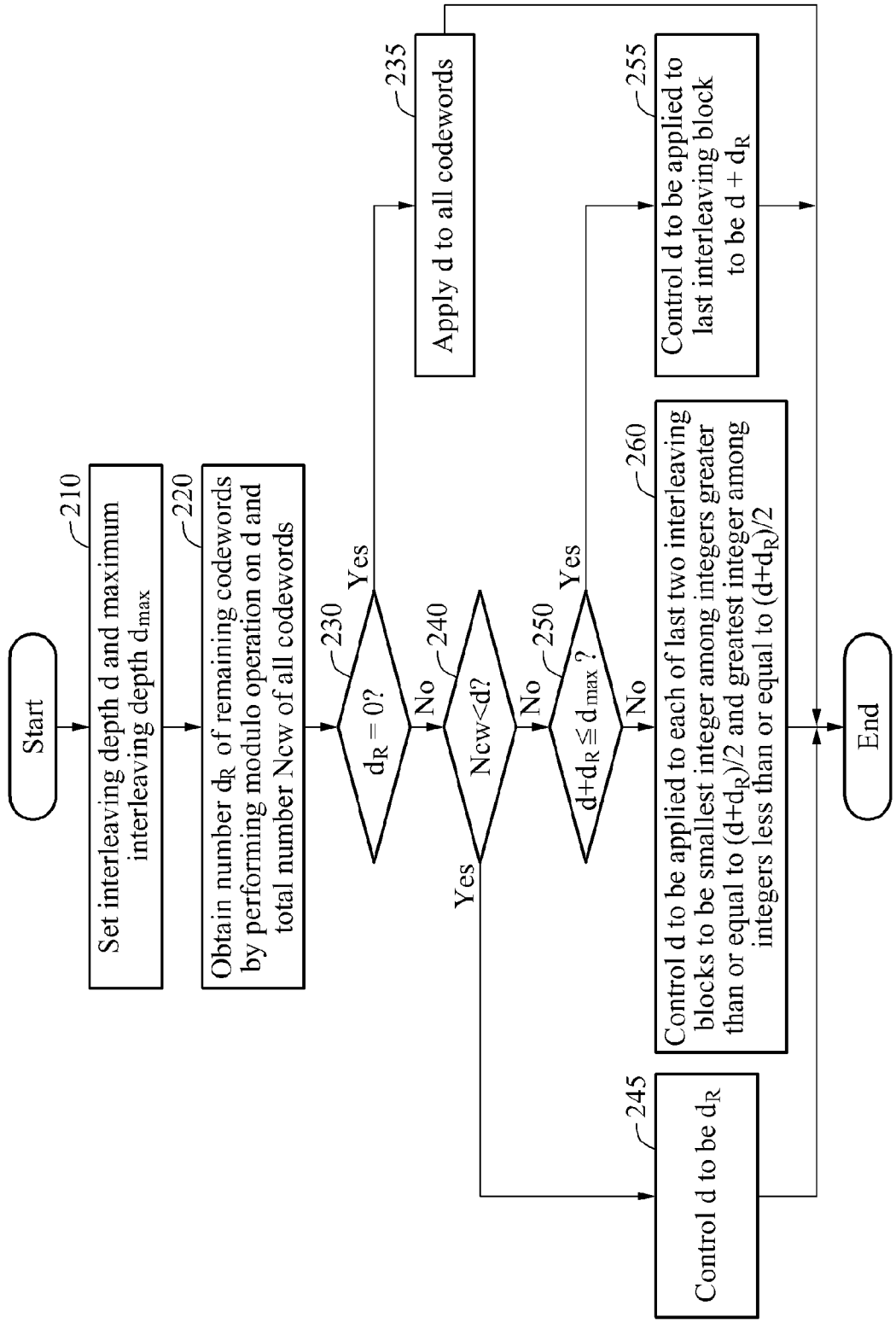
FIG. 2 is a flowchart illustrating an example of an interleaving depth controlling method, in accordance with an embodiment.

FIG. 2 is a flowchart illustrating an example of an interleaving depth controlling method, in accordance with an embodiment.

Referring to FIG. 2, in operation 210, the method sets or defines an interleaving depth "d" and a maximum interleaving depth "$d_{max}$". The method sets the maximum interleaving depth to be a maximum allowable interleaving depth for a system. In an example, the method sets the interleaving depth used to perform interleaving within a range of the maximum interleaving depth. In a case of a plurality of modulation sizes, the method sets the maximum interleaving depth as a largest modulation size among the plurality of modulation sizes. For example, when the plurality of modulation sizes is 1, 2, 3, 4, and 5, the method sets or defines the maximum interleaving depth to be 5.

In another example, the method sets or defines the interleaving depth based on a modulation size, which is a number of bits to be mapped to a single symbol. The interleaving depth to be set prior to the interleaving is defined as a basic interleaving depth.

In operation 220, the method obtains a number "$d_R$" of remaining codewords by performing a modulo operation on the interleaving depth and a total number "$M_B$" of all codewords. When the number of the remaining codewords is zero, the method performs the interleaving by applying the interleaving depth to the all codewords, without controlling the set interleaving depth.

However, when the number of the remaining codewords is not zero, the interleaving may not be effectively performed using the set interleaving depth for the remaining codewords. The remaining codewords are included in a last interleaving block of interleaving blocks on which the interleaving is to be performed. When the interleaving is not performed with respect to the remaining codewords, a packet error may occur with respect to the remaining codewords. Also, when the interleaving is performed using a zero-padded codeword, insignificant bit information may need to be sent. As a result, a transmission rate may be adversely affected.

Thus, the method controls the interleaving depth by obtaining the number of the remaining codewords through the execution of the modulo operation on the total number of the codewords and the interleaving depth. For an interleaving block in which the remaining codewords are included, the method controls the interleaving depth within the range of the maximum interleaving depth. Thus, the method performs the interleaving for the all codewords by applying the interleaving depth controlled to be the number of the remaining codewords.

In operation 230, the method determines whether the obtained number of the remaining codewords is zero. The method makes a determination of whether to control the interleaving depth based on whether the number of the remaining codewords is zero. As described in the foregoing, when the number of the remaining codewords is zero, the interleaving depth may not need to be controlled, and the interleaving may be performed with respect to the all codewords by applying the interleaving depth. Conversely, when the number of the remaining codewords is not zero, the interleaving depth is controlled with respect to an interleaving block including the remaining codewords.

In operation 235, when the number of the remaining codewords is 0, the method applies the interleaving depth to the all codewords. As described in the foregoing, when the number of the remaining codewords is zero, the total number of the codewords may be an integer multiple of the interleaving depth. Thus, all of the codewords are determined to be n*d interleaving blocks. The interleaving is then performed by applying the interleaving depth to each interleaving block.

In operation 240, when the number of the remaining codewords is not zero, the method compares the interleaving depth to the total number of the codewords. As described in the foregoing, when the number of the remaining codewords is not zero, the method controls the interleaving depth with respect to a remaining interleaving block including the remaining codewords.

The method determines whether a number of interleaving blocks is one or at least two by comparing the interleaving depth to the total number of the codewords. The method performs the comparison as a standard for controlling the interleaving depth.

In operation 245, when the interleaving depth is greater than the total number of the codewords, the method controls the interleaving depth to be the number of the remaining codewords. When the interleaving depth is greater than the total number of the codewords, only one interleaving block may exist. In such a case, the total number of the codewords may be equal to the number of the remaining codewords. As a result, applying the interleaving depth may not be effective to perform the interleaving.

Accordingly, the method controls the interleaving depth to be the number of the remaining codewords and performs the interleaving with respect to the all codewords by applying the controlled interleaving depth.

In operation 250, when the interleaving depth is less than or equal to the total number of the codewords, the method compares a sum of the interleaving depth and the number of the remaining codewords to the maximum interleaving depth. When the interleaving depth is less than or equal to the total number of the codewords, the method determines that at least two interleaving blocks on which the interleaving is to be performed may exist.

In such a case, the method compares the sum of the interleaving depth and the number of the remaining codewords to the maximum interleaving depth in order to determine whether to incorporate, into one interleaving block, the remaining interleaving block, which includes the remaining codewords, and an interleaving block to which the interleaving depth prior to the remaining interleaving block is applied.

In operation 255, when the sum of the interleaving depth and the number of the remaining codewords is less than and equal to the maximum interleaving depth, the method controls or determines an interleaving depth to be applied to a last interleaving block to be the sum of the interleaving depth and the number of the remaining codewords.

Although interleaving depth values of the remaining codewords and codewords corresponding to the basic interleaving depth prior to the remaining codewords are combined, the sum of the interleaving depth values may be less than or equal to the maximum interleaving depth. As a result, the interleaving is performed by combining the codewords to be a last one interleaving block.

Thus, the method performs the interleaving by controlling the interleaving depth to be applied to the last interleaving block to be the sum of the interleaving depth and the number of the remaining codewords.

In operation 260, when the sum of the interleaving depth and the number of the remaining codewords is greater than the maximum interleaving depth, the method controls an interleaving depth to be applied to each of last two interleaving blocks based on the sum of the interleaving depth and the number of the remaining codewords.

Although the last two interleaving blocks are combined, the interleaving may not be performed once. Thus, the method controls the interleaving depth to be applied to each of the last two interleaving blocks does not excessively decrease compared to the initially set interleaving depth.

When the sum of the interleaving depth and the number of the remaining codewords is greater than the maximum interleaving depth, the method controls the interleaving depth to be applied to each of the last two interleaving blocks to be a smallest integer among integers greater than or equal to $(d+d_R)/2$ and a greatest integer among integers less than or equal to $(d+d_R)/2$. In one illustrative example, "$(d+d_R)/2$" is an average between the number of the remaining codewords and a basic interleaving depth.

Accordingly, in accordance with an illustrative configuration of the method of FIG. 2, a decrease in a packet error rate is overcome by preventing a value of the controlled interleaving depth from excessively decreasing compared to a value of the initially set interleaving depth.

Figure 3:
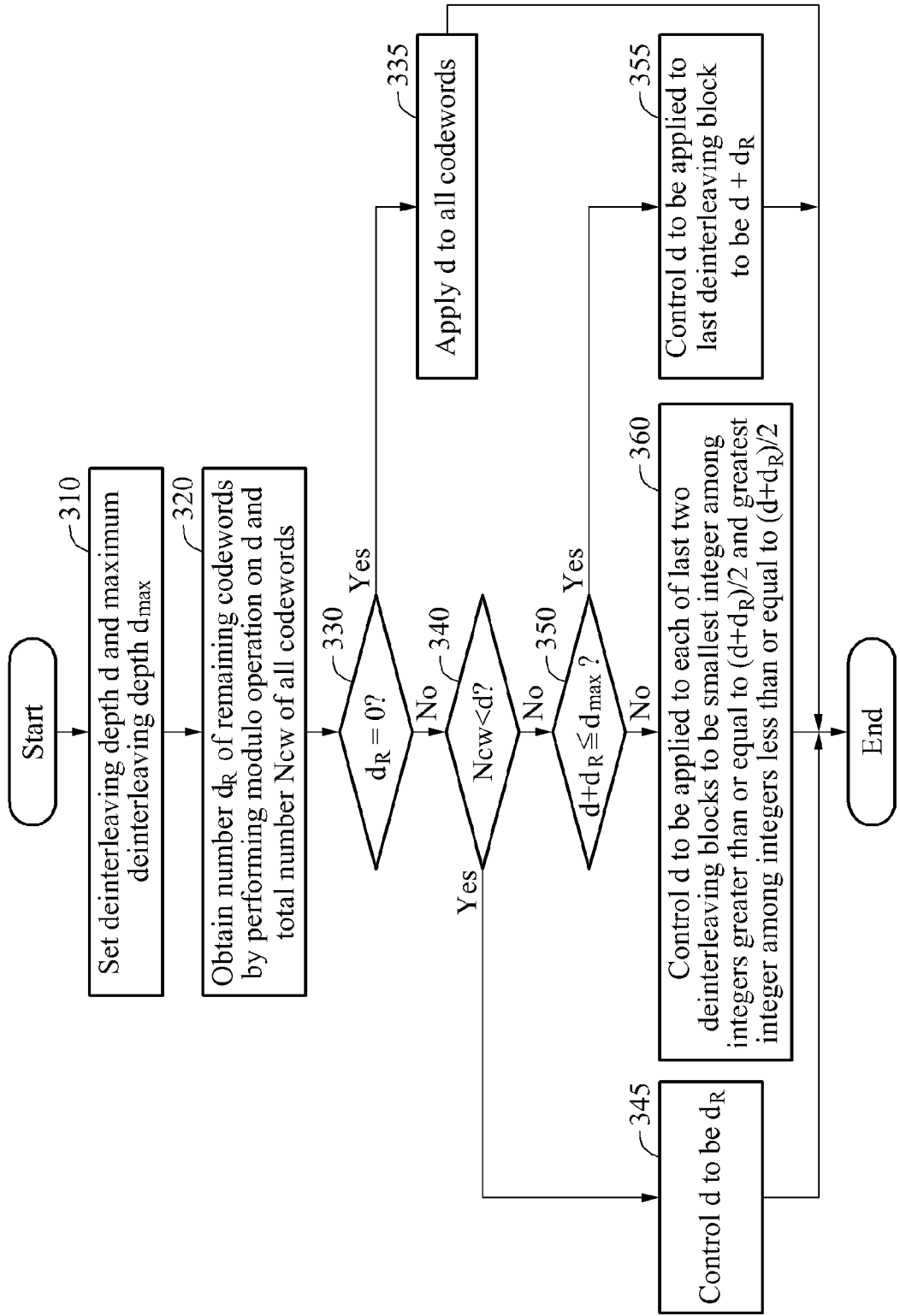
FIG. 3 is a flowchart illustrating an example of a deinterleaving depth controlling method, in accordance with an embodiment.

FIG. 3 is a flowchart illustrating an example of a deinterleaving depth controlling method, in accordance with an embodiment.

Referring to FIG. 3, in operation 310, the method sets or defines a deinterleaving depth (d) and a maximum deinterleaving depth ($d_{max}$). In one illustrative example, the method sets the maximum deinterleaving depth to be a maximum allowable deinterleaving depth for a system. In a case of a plurality of modulation sizes, the method sets the maximum deinterleaving depth as a largest modulation size among the plurality of modulation sizes. In an example, the method sets the deinterleaving depth to perform deinterleaving within a range of the maximum deinterleaving depth. In another example, the method sets the deinterleaving depth by controlling the deinterleaving depth to be equal to an interleaving depth applied to all codewords.

In operation 320, the method obtains a number of remaining codewords ($d_R$) by performing a modulo operation on the deinterleaving depth and a total number of all codewords. When the number of the remaining codewords is zero, the method performs the deinterleaving based on the deinterleaving depth with respect to the all codewords without controlling the set deinterleaving depth.

In operation 330, the method determines whether the obtained number of the remaining codewords is zero. The method determines whether to control the deinterleaving depth based on whether the number of the remaining codewords is zero.

In operation 335, when the number of the remaining codewords is zero, the method defines deinterleaving depth be an initially set deinterleaving depth. When the number of the remaining codewords is zero, the method defines the total number of the codewords to be an integer multiple of the deinterleaving depth, and determines all of the codewords to be an n*d deinterleaving blocks. Thus, the method performs the deinterleaving by applying the deinterleaving depth to each deinterleaving block.

In operation 340, when the number of the remaining codewords is not zero, the method compares the deinterleaving depth to the total number of the codewords. As described in the foregoing, when the number of the remaining codewords is not zero, the method controls the deinterleaving depth with respect to a deinterleaving block including the remaining codewords.

The method determines whether a number of the deinterleaving blocks is one or at least two by comparing the deinterleaving depth to the total number of the codewords. The method uses the comparison as a standard for controlling the deinterleaving depth.

In operation 345, when the deinterleaving depth is greater than the total number of the codewords, the method controls the deinterleaving depth to be the number of the remaining codewords. When the deinterleaving depth is greater than the total number of the codewords, the method determines that only one deinterleaving block exits. In such a case, the total number of the codewords is equal to the number of the remaining codewords and; thus, a deinterleaving block to which the deinterleaving depth is to be applied is not formed.

Thus, the method controls the deinterleaving depth to be the number of the remaining codewords to form one deinterleaving block with respect to the all codewords. The method performs deinterleaving on a deinterleaving block to which the deinterleaving depth controlled to be the number of the remaining codewords is applied.

In operation 350, when the deinterleaving depth is less than or equal to the total number of the codewords, the method compares a sum of the deinterleaving depth and the number of the remaining codewords to the maximum deinterleaving depth. When the deinterleaving depth is less than or equal to the total number of the codewords, at least two deinterleaving blocks on which the deinterleaving is to be performed exist.

In operation 355, when the sum of the deinterleaving depth and the number of the remaining codewords is less than or equal to the maximum deinterleaving depth, the method controls a deinterleaving depth to be applied to a last deinterleaving block to be the sum of the deinterleaving depth and the number of the remaining codewords.

In operation 360, when the sum of the deinterleaving depth and the number of the remaining codewords is greater than the maximum deinterleaving depth, the method controls a deinterleaving depth to be applied to each of last two deinterleaving blocks based on the sum of the deinterleaving depth and the number of the remaining codewords.

When the sum of the deinterleaving depth and the number of the remaining codewords is greater than the maximum deinterleaving depth, the method controls the deinterleaving depth to be applied to each of the last two deinterleaving blocks to be a smallest integer among integers greater than or equal to $(d+d_R)/2$ and a greatest integer among integers less than or equal to $(d+d_R)/2$. As described in the foregoing, "$(d+d_R)/2$" is an average between the number of the remaining codewords and a basic deinterleaving depth.

As described in the foregoing, a receiving end performs the deinterleaving corresponding to signal processing opposite to recording and reading data performed by a transmitting end. The deinterleaving depth controlling method performed during the deinterleaving may be performed simultaneously with an interleaving depth controlling method.

Figure 4:
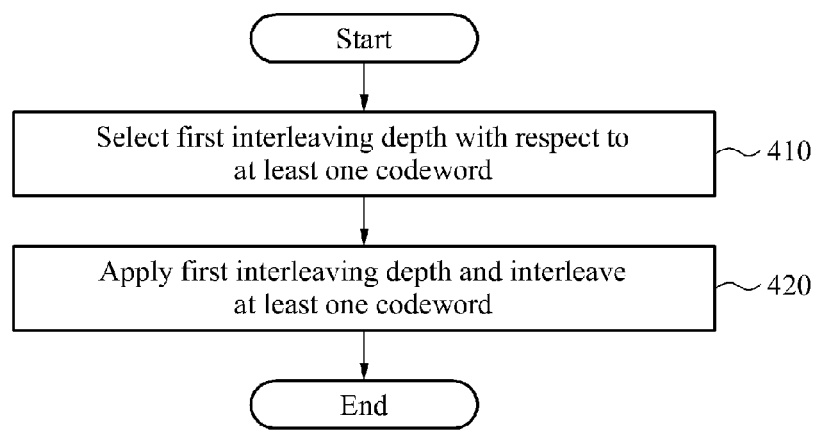
FIG. 4 is a flowchart illustrating an example of an interleaving method, in accordance with an embodiment.

FIG. 4 is a flowchart illustrating an example of an interleaving method, in accordance with an embodiment.

Referring to FIG. 4, in operation 410, the method selects a first interleaving depth with respect to at least one codeword based on a number of the at least one codewords and a maximum interleaving depth. The first interleaving depth is an interleaving depth to be controlled to perform interleaving on an entirety or a portion of all codewords. A method of selecting the first interleaving depth will be described with reference to FIG. 5.

In operation 420, the method interleaves the at least one codeword by applying the selected first interleaving depth. The at least one codeword includes an interleaving block corresponding to the first interleaving depth, and the method performs the interleaving by applying the first interleaving depth corresponding to the interleaving block.

Figure 5:
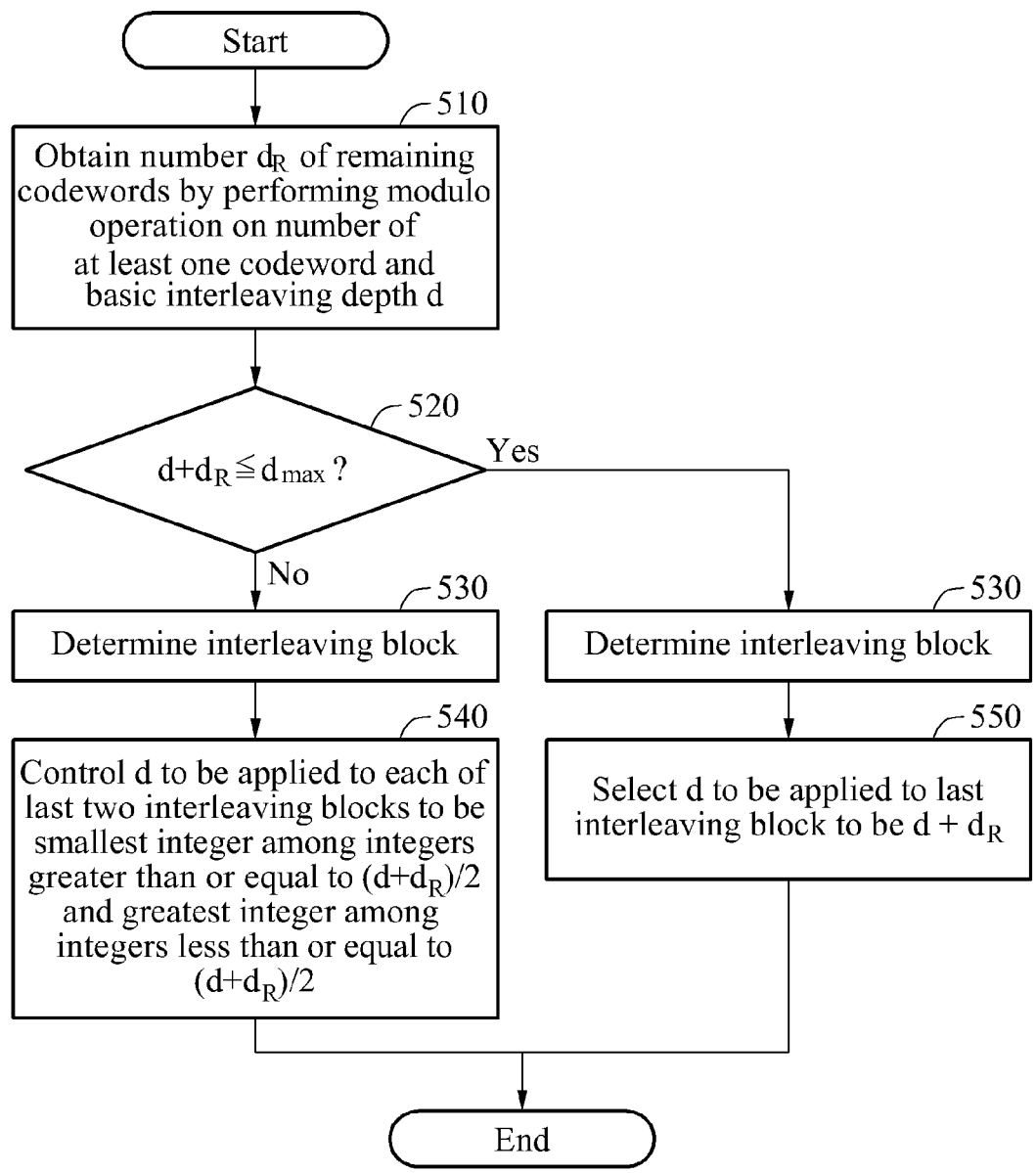
FIG. 5 is a flowchart illustrating an example of an interleaving depth controlling method in an interleaving method, in accordance with an embodiment.

FIG. 5 is a flowchart illustrating an example of an interleaving depth controlling method in an interleaving method, in accordance with an embodiment.

Referring to FIG. 5, in operation 510, the method obtains a number of remaining codewords ($d_R$) resulting from a modulo operation performed on a number of at least one codeword and a basic interleaving depth (d). In an example, the basic interleaving depth is selected within a range of a maximum interleaving depth. In another example, the basic interleaving depth is selected based on a modulation size, which is a number of bits to be mapped to a signal symbol.

In operation 520, the method compares a sum of the basic interleaving depth and the number of the remaining codewords to the maximum interleaving depth. The method determines whether to incorporate into one block, a remaining interleaving block including the remaining codewords and an interleaving block prior to the remaining interleaving block by comparing the sum of the basic interleaving depth and the number of the remaining codewords to the maximum interleaving depth.

In operation 530, the method determines an interleaving block irrespective of a result of the comparing performed in operation 520. However, in one configuration, the method may determine the interleaving block differently based on the result of the comparing. For example, when the sum of the number of the remaining codewords and the basic interleaving depth is less than or equal to the maximum interleaving depth, the method combines the remaining interleaving block including the remaining codewords with the interleaving block prior to the remaining interleaving block.

Conversely, when the sum of the number of the remaining codewords and the basic interleaving depth is greater than the maximum interleaving depth, the method determines two last interleaving blocks by controlling each interleaving depth of the remaining interleaving block and the interleaving block prior to the remaining interleaving block.

In operation 550, when the sum of the number of the remaining codewords and the basic interleaving depth is less than or equal to the maximum interleaving depth, the method selects a first interleaving depth to be applied to a last interleaving block among interleaving blocks to be the sum of the number of the remaining codewords and the basic interleaving depth.

As described in the foregoing, in one illustrative example, the remaining interleaving block and the interleaving block prior to the remaining interleaving block are combined into the last interleaving block. Thus, to perform interleaving on the last interleaving block, the first interleaving depth is controlled to correspond to the sum of the number of the remaining codewords and the basic interleaving depth.

In operation 540, when the sum of the number of the remaining codewords and the basic interleaving depth is greater than the maximum interleaving depth, the method selects a first interleaving depth to be applied to each of last two interleaving blocks among the interleaving blocks may be selected based on the sum of the number of the remaining codewords and the basic interleaving depth. When a sum of the number of the remaining codewords and a basic interleaving depth is greater than the maximum interleaving depth, the method controls the interleaving depth to be applied to each of the last two interleaving blocks to be a smallest integer among integers greater than or equal to $(d+d_R)/2$ and a greatest integer among integers less than or equal to $(d+d_R)/2$. As described in the foregoing, "$(d+d_R)/2$" may indicate an average between the number of the remaining codewords and the basic interleaving depth.

In such a case, the interleaving is not performed once although the last two interleaving blocks are combined. Thus, the interleaving depth to be applied to each of the last two interleaving blocks is controlled to not be excessively reduced compared to an initially set interleaving depth.

As an example, in a multi-bit modulation and demodulation system, a number of bits to be mapped to a single symbol correspond to a modulation size of 1 through 5. In such an example, setting an interleaving depth (d) to be the modulation size is effective and a maximum interleaving depth ($d_{max}$) is set to be 5.

Table 3 indicates the interleaving depth (d) when a number of remaining codewords ($d_R$) is not zero and a total number ($M_B$) of all codewords is greater than the interleaving depth (d).

TABLE 3

| | | Interleaving depth | | |
|---|---|---|---|---|
| d | $d_R$ | Initial $N_B$ - 2 block | $N_B$ - 1-th block | $N_B$-th block |
| 2 | 1 | 2 | 3 | N/A |
| 3 | 1 | 3 | 4 | N/A |
|   | 2 |   | 5 | N/A |
| 4 | 1 | 4 | 5 | N/A |
|   | 2 |   | 3 | 3 |
|   | 3 |   | 4 | 3 |
| 5 | 1 | 5 | 3 | 3 |
|   | 2 |   | 4 | 3 |
|   | 3 |   | 4 | 4 |
|   | 4 |   | 5 | 4 |

In Table 3, "N/A" indicates nonexistence of an interleaving block in a corresponding order. A method of controlling the interleaving depth by comparing the sum of the number of the remaining codewords and the interleaving depth to the maximum interleaving depth will be further described with reference to FIGS. 6 and 7.

Figure 6:
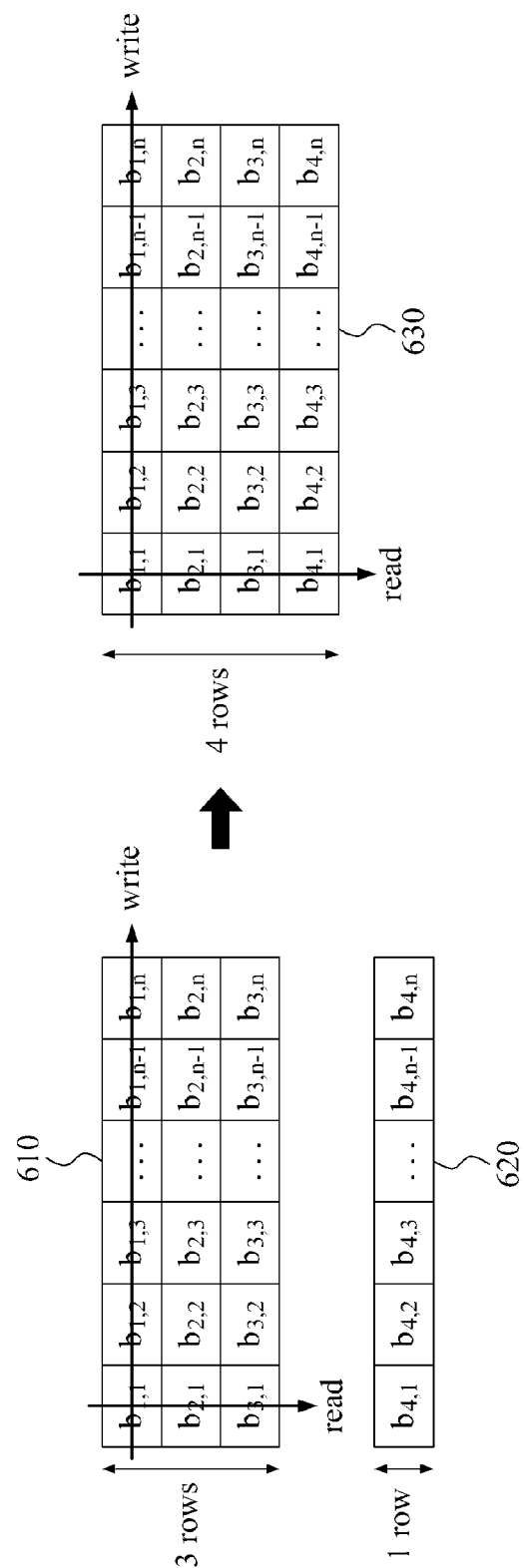
FIG. 6 is diagram illustrating an example of controlling an interleaving depth when a sum of a number of remaining codewords and the interleaving depth is less than or equal to a maximum interleaving depth, in accordance with an embodiment.

FIG. 6 is diagram illustrating an example of controlling an interleaving depth when a sum of a number of remaining codewords and the interleaving depth is less than or equal to a maximum interleaving depth, in accordance with an embodiment.

Referring to FIG. 6, an interleaving block 610 to which an interleaving depth of 3 is to be applied and a remaining interleaving block 620 are determined for all codewords. The interleaving block 610 includes 3 rows, and the interleaving depth is applied to perform interleaving on the interleaving block 610.

However, the remaining interleaving block 620 includes 1 row, less than the interleaving depth of 3. As a result, the interleaving depth is not applied. Thus, the interleaving is not performed to the remaining interleaving block 620. When transmitting the remaining interleaving block 620, a packet error rate of the remaining interleaving block 620 increases. Also, when adding two zero-padded codewords to form 3 rows and applying the interleaving depth to perform the interleaving, insignificant codewords are transmitted and; thus, a transmission rate decreases.

When the sum of the number of the remaining codewords and the interleaving depth is less than or equal to the maximum interleaving depth, the interleaving depth is controlled to be the sum of the number of the remaining codewords and the interleaving depth.

In the example of FIG. 6, the interleaving depth is controlled to be 4, which is the sum of the number of the remaining codewords and the interleaving depth. Thus, the interleaving is performed by forming all of the codewords to be an interleaving block 630 having 4 rows. When the interleaving depth increases, a time delay may occur. However, a decrease in a packet error rate is overcome.

Figure 7:
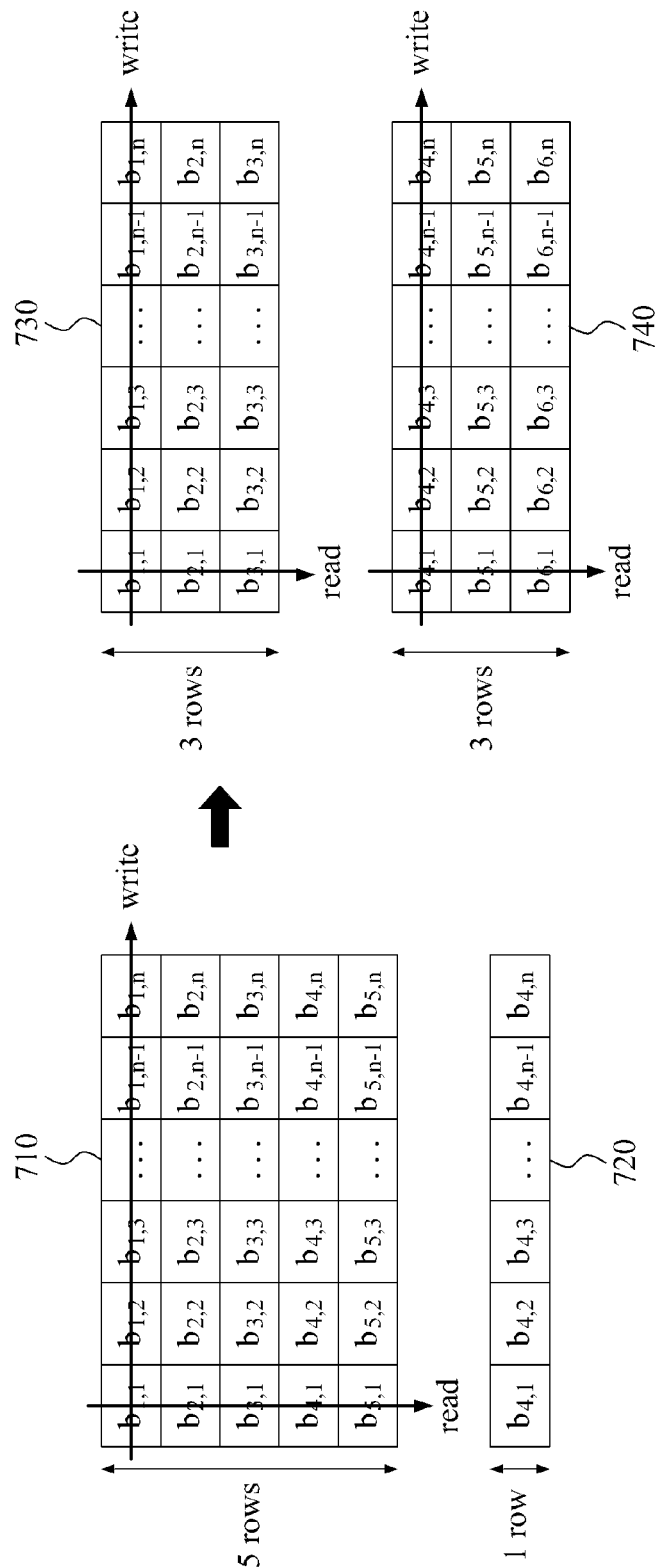
FIG. 7 is a diagram illustrating an example of controlling an interleaving depth when a sum of a number of remaining codewords and the interleaving depth is greater than a maximum interleaving depth, in accordance with an embodiment.

FIG. 7 is a diagram illustrating an example of controlling an interleaving depth when a sum of a number of remaining codewords and the interleaving depth is greater than a maximum interleaving depth, in accordance with an embodiment.

In the example of FIG. 7, a total number of all codewords is 6, the interleaving depth is 5, and the maximum interleaving depth is 5.

Referring to FIG. 7, an interleaving block 710 to which the interleaving depth of 5 is to be applied and a remaining interleaving block 720 are determined for all of the codewords. The interleaving block 710 includes 5 rows, and the interleaving depth is applied to perform interleaving on the interleaving block 710.

However, the remaining interleaving block 720 includes 1 row, less than the interleaving depth of 5 of the interleaving block 710, and; thus, the interleaving depth is not applied. Thus, the interleaving is not performed for the interleaving block 720. When transmitting the remaining interleaving block 720, a packet error rate of the remaining interleaving block 720 may increase. Also, when adding 4 zero-padded codewords to form 5 rows and applying the interleaving depth to perform the interleaving, insignificant codewords are transmitted and; as a result, a transmission rate decreases.

When the sum of the number of the remaining codewords and the interleaving depth is greater than the maximum interleaving depth, an interleaving depth to be applied to each of the two interleaving blocks 710 and 720 is controlled to be a smallest integer among integers greater than or equal to an average between the number of the remaining codewords and a basic interleaving depth. Also, the interleaving depth to be applied to each of the two interleaving blocks 710 and 720 is controlled to be a greatest integer among integers less than or equal to the average between the number of the remaining codewords and the basic interleaving depth.

In the example of FIG. 7, the interleaving depth is controlled to be 3, which is the average between the number of the remaining codewords and the interleaving depth. Thus, the interleaving is performed by forming the all codewords to be two interleaving blocks 730 and 740 having 3 rows. An interleaving depth to be applied to each of the two interleaving blocks 730 and 740 is controlled not to be excessively reduced from an initially set interleaving depth.

Table 4 indicates a detailed system of a multi-bit modulation and demodulation method.

TABLE 5

| | | Interleaving depth sequence | |
|---|---|---|---|
| d | $d_R$ | $M_B < d$ | $M_B \geq d$ |
| 1 | 0 | | $1 \cdot ones(N_B)$ |
| 2 | 0 | | $2 \cdot ones(N_B)$ |
| | 1 | 1 | $[2 \cdot ones(N_B - 2), 3]$ |
| 3 | 0 | | $3 \cdot ones(N_B)$ |
| | 1 | 1 | $[3 \cdot ones(N_B - 2), 4]$ |
| | 2 | 2 | $[3 \cdot ones(N_B - 2), 5]$ |
| 5 | 0 | | $5 \cdot ones(N_B)$ |
| | 1 | 1 | $[5 \cdot ones(N_B - 2), 3, 3]$ |
| | 2 | 2 | $[5 \cdot ones(N_B - 2), 4, 3]$ |
| | 3 | 3 | $[5 \cdot ones(N_B - 2), 4, 4]$ |
| | 4 | 4 | $[5 \cdot ones(N_B - 2), 5, 4]$ |

Figure 8:
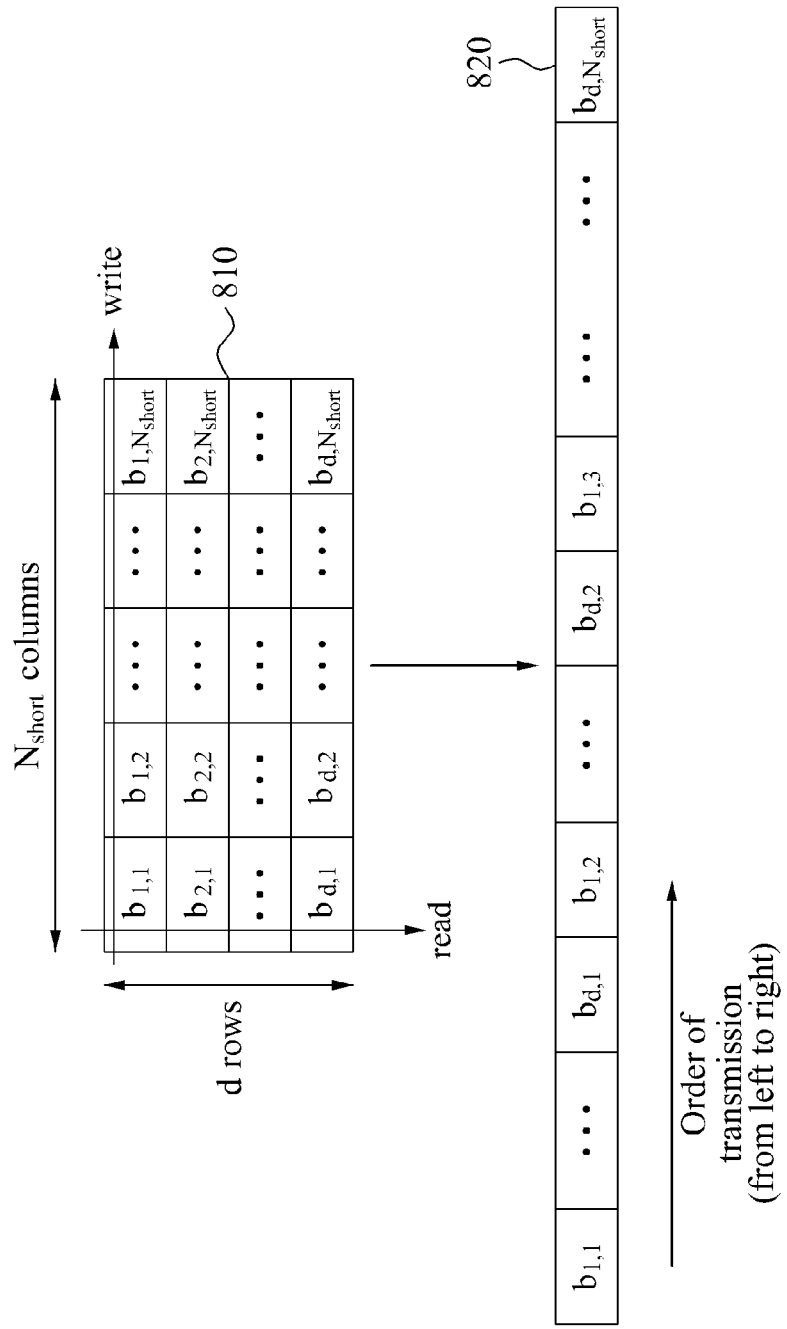
FIG. 8 is a diagram illustrating an example of an interleaving procedure, in accordance with an embodiment.

FIG. 8 is a diagram illustrating an example of an interleaving procedure, in accordance with an embodiment.

For example, in the presence of a data symbol error, bit-level interleaving are used along with a shortened BCH code to allow encoded data to be resilient to a bit error.

When a codeword length is $N_{short}$ and an interleaving depth is d, the interleaving is performed as follows.

Collect d blocks of codewords.

In one example, d BCH codewords is collected, and each BCH codeword has $N_{short}$ bits.

(2) Write, row-wise, bits of the BCH codewords in a $d*N_{short}$ dimensional array 810.

In one embodiment, each bit of the d BCH codewords are written in the $d*N_{short}$ dimensional array 810. The d BCH codewords are formed in a single array, which is the $d*N_{short}$ dimensional array 810. The $d*N_{short}$ dimensional array 810 are configured based on the bits of the d BCH codewords.

(3) Read, column-wise, the $d*N_{short}$ dimensional array 810 and sequentially output data.

In one example, the bits written in the $d*N_{short}$ dimensional array 810, for example, $b_{1,1}, b_{2,1}, \ldots, b_{d,1}, b_{1,2},$

TABLE 4

| Data rate number | Code used | Modulation duty cycle | Interleaving depth (d) | M (bits per symb) | L (chips per symb) | Data rate at 2.4 GHz (kbps) | Data rate at 900 MHz (kbps) |
|---|---|---|---|---|---|---|---|
| D1 | 1/1-TOOK | 0.50 | 1 | 1 | 1 | 809.5 | 485.7 |
| D2 | 2/4-TOOK | 0.25 | 2 | 2 | 4 | 404.8 | 242.8 |
| D3 | 3/8-TOOK | 0.50 | 3 | 3 | 8 | 303.5 | 182.14 |
| D6 | 5/32-TOOK | 0.50 | 5 | 5 | 32 | 126.5 | 75.9 |

In an illustrative example, the ternary on off keying (TOOK) is interchangeably used as a ternary amplitude shift keying (TASK).

In Table 4, "M" indicates a number of bits mapped to a symbol during multi-bit modulation and demodulation. A basic interleaving depth (d) is set to be equal to a value of M. A procedure of signal processing performing interleaving by applying the basic interleaving depth is as follows.

Bit-level interleaving may be performed on encoded data by obtaining a codeword from a Bose Chaudhuri Hocquenghem (BHC) encoder, and bits across codewords are interleaved using an appropriately selected depth. The foregoing procedure is performed to protect a bit error against a symbol error. The interleaving depth is selected based on a modulation size. Table 5 indicates interleaving depth sequences obtained by expressing, as a row vector, an interleaving depth value in each interleaving block in a system described with reference to FIG. 4, in accordance with an embodiment.

$b_{2,2}, \ldots, b_{d,2}, b_{1,2}, \ldots, b_{d,Nshort}$ (820), are sequentially transmitted. The bits sequentially read are transmitted to a receiver.

The units, the acquirer, the comparers, the determiner, the performer, and the controller described herein may be implemented using hardware components. For example, the hardware components may include, but are not limited to, comparators, receivers, transmitters, processors, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may nn an operating system (OS) and one or more software applications that run on the OS. The processing device also may access, store, manipulate, process, and create data in response to execution of the software. For purpose of simplicity, the description of a processing device is used as singular, however, one skilled in the art will appreciated that a processing device may include multiple processing elements and multiple types of processing elements. For example, a processing device may include multiple processors or a processor and a controller. In addition, different processing configurations are possible, such a parallel processors.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A digital communication method with interleaving depth control, utilizing a processor, the method comprising:
    performing a modulo operation on an initial interleaving depth and a total number of blocks with respect to bits;
    comparing the total number of the blocks to the initial interleaving depth, in response to a result of the modulo operation excluding "0"; and
    applying an interleaving with an interleaving depth for an interleaving block in response to the initial interleaving depth being greater than the total number of the blocks,
    wherein the interleaving depth is the result of the modulo operation, and the interleaving block is generated based on codewords comprising the bits.

2. The method of claim 1, in response to the initial interleaving depth being less than or equal to the total number of the blocks, further comprising:
    comparing a sum of the result of the modulo operation and the initial interleaving depth to a maximum interleaving depth.

3. The method of claim 2, further comprising:
    in response to the sum of the result of the modulo operation and the initial interleaving depth being less than or equal to a maximum interleaving depth,
    applying an interleaving with the initial interleaving depth for ($N_B$-2) interleaving blocks, the $N_B$ denoting a number of the interleaving blocks; and
    applying an interleaving with another interleaving depth for remainder excluding the ($N_B$-2) interleaving blocks, the other interleaving depth being a sum of the result of the modulo operation and the initial interleaving depth.

4. The method of claim 2, further comprising:
    in response to the sum of the result of the modulo operation and the initial interleaving depth being greater than a maximum interleaving depth,
    applying an interleaving with the initial interleaving depth for ($N_B$-2) interleaving blocks, the $N_B$ denoting a number of the interleaving blocks;
    applying an interleaving with a first interleaving depth for ($N_B$-1)th interleaving block; and
    applying an interleaving with a second interleaving depth for ($N_B$)th interleaving block,
    wherein the first and second interleaving depth are determined based on the sum of the result of the modulo operation and the interleaving depth.

5. The method of claim 4, wherein:
    the first interleaving depth is a smallest integer among integers greater than or equal to an average between the result of the modulo operation and the initial interleaving depth, and
    the second interleaving depth is a greatest integer among integers less than or equal to the average between the result of the modulo operation and the initial interleaving depth.

6. The method of claim 1 wherein the initial interleaving depth is to be selected based on a modulation size, which is a number of bits to be mapped to a single symbol.

7. A computer program embodied on a non-transitory computer readable medium, the computer program being configured to control a processor to perform the method of claim 1.

8. A digital communication method with deinterleaving depth control, utilizing a processor, the method comprising:
    performing a modulo operation on an initial deinterleaving depth and a total number of blocks with respect to bits;
    comparing the total number of the blocks to the initial deinterleaving depth, in response to a result of the modulo operation excluding "0"; and
    applying a deinterleaving with a deinterleaving depth for a deinterleaving block in response to the initial deinterleaving depth being greater than the total number of the blocks,
    wherein the deinterleaving depth is the result of the modulo operation, and the deinterleaving block is generated based on codewords comprising the bits.

9. The method of claim 8, in response to the initial deinterleaving depth being less than or equal to the total number of the blocks, further comprising:
    comparing a sum of the result of the modulo operation and the initial deinterleaving depth to a maximum deinterleaving depth.

10. The method of claim 9, in response to the sum of the result of the modulo operation and the initial deinterleaving depth being less than or equal to a maximum deinterleaving depth, further comprising:
    applying an deinterleaving with the initial interleaving depth for ($N_B$-2) deinterleaving blocks, the $N_B$ denoting a number of the deinterleaving blocks; and
    applying an deinterleaving with another deinterleaving depth for remainder excluding the ($N_B$-2) deinterleaving blocks, the other deinterleaving depth being a sum of the result of the modulo operation and the initial deinterleaving depth.

11. The method of claim 9, in response to the sum of the result of the modulo operation and the initial deinterleaving depth being greater than a maximum deinterleaving depth, further comprising:
    applying an deinterleaving with the initial deinterleaving depth for ($N_B$-2) deinterleaving blocks, the $N_B$ denoting a number of the deinterleaving blocks;
    applying an deinterleaving with a first deinterleaving depth for ($N_B$-1)th deinterleaving block; and
    applying an deinterleaving with a second deinterleaving depth for ($N_B$)th deinterleaving block, wherein the first and second interleaving depth are determined based on the sum of the result of the modulo operation and the initial deinterleaving depth.

12. The method of claim 11, wherein:
the first interleaving depth is a smallest integer among integers greater than or equal to an average between the result of the modulo operation and the initial deinterleaving depth, and
the second interleaving depth is a greatest integer among integers less than or equal to the average between the result of the modulo operation and the initial deinterleaving depth.

13. A computer program embodied on a non-transitory computer readable medium, the computer program being configured to control a processor to perform the method of claim 8.

14. A digital communication apparatus with interleaving depth control, comprising:
a processor comprising:
an acquirer configured to perform a modulo operation on an initial interleaving depth and a total number of blocks with respect to bits;
a first comparer configured to compare the total number of the blocks to the initial interleaving depth in response to a result of the modulo operation excluding "0"; and
an interleaving performer configured to apply an interleaving with an interleaving depth for an interleaving block in response to the initial interleaving depth being greater than the total number of the blocks,
wherein the interleaving depth is the result of the modulo operation, and the interleaving block is generated based on codewords comprising the bits.

15. The apparatus of claim 14, wherein the processor further comprises:
in response to the initial interleaving depth being less than or equal to the total number of the blocks,
a second comparer configured to compare a sum of the result of the modulo operation and the initial interleaving depth to the maximum interleaving depth.

16. The apparatus of claim 14, wherein the processor further comprises:

an interleaving block determiner configured to determine all of the codewords to be one interleaving block.

17. The apparatus of claim 14, wherein in response to a sum of the result of the modulo operation and the initial interleaving depth being less than or equal to a maximum interleaving depth, the interleaving performer is further configured to:
apply an interleaving with the initial interleaving depth for ($N_B$-2) interleaving blocks, the $N_B$ denoting a number of the interleaving blocks; and
apply an interleaving with another interleaving depth for remainder excluding the ($N_B$-2) interleaving blocks, the other interleaving depth being a sum of the result of the modulo operation and the initial interleaving depth.

18. The apparatus of claim 14, wherein in response to a sum of the result of the modulo operation and the initial interleaving depth being greater than a maximum interleaving depth, the interleaving performer is further configured to:
apply an interleaving with the initial interleaving depth for ($N_B$-2) interleaving blocks, the $N_B$ denoting a number of the interleaving blocks;
apply an interleaving with a first interleaving depth for ($N_B$-1)th interleaving block; and
apply an interleaving with a second interleaving depth for ($N_B$)th interleaving block,
wherein the first and second interleaving depth are determined based on the sum of the result of the modulo operation and the interleaving depth.

19. The apparatus of claim 14, wherein:
the first interleaving depth is a smallest integer among integers greater than or equal to an average between the result of the modulo operation and the interleaving depth, and
the second interleaving depth is a greatest integer among integers less than or equal to the average between the result of the modulo operation and the interleaving depth.

* * * * *